United States Patent
Fontana, Jr. et al.

(10) Patent No.: US 7,148,072 B2
(45) Date of Patent: Dec. 12, 2006

(54) METHOD AND APPARATUS FOR OXIDIZING CONDUCTIVE REDEPOSITION IN TMR SENSORS

(75) Inventors: Robert E. Fontana, Jr., San Jose, CA (US); Howard G. Zolla, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 94 days.

(21) Appl. No.: 10/857,364

(22) Filed: May 28, 2004

(65) Prior Publication Data
US 2005/0274998 A1   Dec. 15, 2005

(51) Int. Cl.
*H01L 21/00* (2006.01)

(52) U.S. Cl. .................. 438/3; 438/4; 438/63

(58) Field of Classification Search ............ 438/3, 438/4, 63
See application file for complete search history.

(56) References Cited

U.S. PATENT DOCUMENTS 6,278,582 B1    8/2001  Okawa et al.
6,610,373 B1 *  8/2003  Nakajima et al. ........... 427/534
6,656,894 B1   12/2003  Peters et al.
6,831,314 B1 * 12/2004  Higo et al. .................. 257/295
6,879,514 B1 *  4/2005  Hosomi et al. .............. 365/158
2003/0231437 A1* 12/2003 Childress et al. ......... 360/324.12

FOREIGN PATENT DOCUMENTS

| JP | 61039524 A | 2/1986 |
| JP | 4098747 A | 3/1992 |
| JP | 5109668 A | 4/1993 |
| JP | 10135233 A | 5/1998 |

OTHER PUBLICATIONS

Takeshi Hattori, "Implementing a single-wafer cleaning technology suitable for minifab operations," Micromagazine.com, 13 pages.

* cited by examiner

*Primary Examiner*—Andy Huynh
(74) *Attorney, Agent, or Firm*—David W. Lynch; Chambliss, Bahner & Stophel P.C.

(57) ABSTRACT

A method and apparatus for oxidizing conductive redeposition in TMR sensors is disclosed. A TMR barrier layer is etched. Redeposition material is oxidized and the barrier is healed using an oxidizing agent selected from the group consisting of ozone and water vapor.

12 Claims, 11 Drawing Sheets

METHOD AND APPARATUS FOR OXIDIZING CONDUCTIVE REDEPOSITION IN TMR SENSORS

BACKGROUND OF THE INVENTION

1. Field of the Invention

This disclosure relates in general to tunnel magnetoresistive devices, and more particularly to a method and apparatus for oxidizing conductive redeposition in TMR sensors.

2. Description of Related Art

Magnetic recording media have been predominantly magnetic disks and magnetic tapes. They are manufactured by forming a thin magnetic film on an Al substrate or a resin tape. A magnetic head utilizing an electromagnetic conversion operation is used in order to write and read magnetic information to and from these magnetic media. This magnetic head comprises a write portion for writing the magnetic information to the recording medium and a read portion for reading out the magnetic information from the recording medium. A so-called "induction type head", which comprises a coil and magnetic poles that wrap the coil from above and below and are electrically connected to the coil, is generally used for the write portion.

Magneto-resistive (MR) sensors based on anisotropic magneto-resistance (AMR) or a spin-valve (SV) effect are widely known and extensively used as read transducers to read magnetic recording media. Such MR sensors can probe the magnetic stray field coming out of transitions recorded on a recording medium by generating resistance changes in a reading portion formed of magnetic materials. AMR sensors have a low resistance change ratio or magneto-resistive ratio ΔR/R, whereas SV sensors have a much higher ΔR/R for the same magnetic field excursion. SV heads showing such high sensitivity are able to achieve very high recording densities.

In a basic SV sensor, two ferromagnetic layers are separated by a non-magnetic layer. An exchange or pinning layer is further provided adjacent to one of the ferromagnetic layers. The exchange layer and the adjacent ferromagnetic layer are exchange-coupled so that the magnetization of the ferromagnetic layer is strongly pinned or fixed in one direction. The magnetization of the other ferromagnetic layer is free to rotate in response to a small external magnetic field. When the magnetizations of the ferromagnetic layers are changed from a parallel to an anti-parallel configuration, the sensor resistance increases yielding a relatively high MR ratio.

Recently, new MR sensors using tunneling magneto-resistance (TMR) have shown great promise for their application to ultra-high density recordings. These sensors, which are known as magnetic tunnel junction (MTJ) sensors or magneto-resistive tunnel junctions (MRTJ), came to the fore when large TMR was first observed at room temperature. Like SV sensors, MTJ sensors basically include two ferromagnetic layers separated by a non-magnetic layer. One of the magnetic layers has its magnetic moment fixed along one direction, i.e., the fixed or pinned layer, while the other layer, i.e., free or sensing layer, is free to rotate in an external magnetic field. However, unlike SV sensors, this non-magnetic layer between the two ferromagnetic layers in MTJ sensors is a thin insulating barrier or tunnel barrier layer. The insulating layer is thin enough so that electrons can tunnel through the insulating layer. Further, unlike SV sensors, MTJ sensors operate in CPP (Current Perpendicular to the Plane) geometry, which means its sensing current flows in a thickness direction of a laminate film or orthogonal to the surfaces of the ferromagnetic layers.

The relative magnetic direction orientation or angle of the two magnetic layers is affected by an external magnetic field such as the transitions in a magnetic recording medium. This affects the MTJ resistance and thus the voltage of the sensing current or output voltage. By detecting the change in resistance and thus voltage based on the change in relative magnetization angle, changes in an external magnetic field are detected. In this manner, MTJ sensors are able to read magnetic recording media.

In the patterning of tunnel magnetoresistive (TMR) sensors, ion milling is commonly used in recording head structures and reactive ion etching (RIE) is commonly used in magnetic random access memory (MRAM) structures. While both of these techniques are effective in patterning the sensor material, both leave behind two artifacts, which create a parasitic resistance path, which is parallel to the remaining structure.

The first artifact is redeposited metal (redep). When patterning TMR structures it is quite common for some metal to be milled away from the field and redeposited on the sides of the TMR stack. However, this material can be conductive. The parasitic resistance created by this conductive material lowers the SNR in a functioning device.

The second artifact is ion damage to the barrier layer. TMR structures typically employ an oxide insulator barrier layer. The ion milling and RIE are both prone to damage the edge of the oxide insulator barrier layer and deplete it of oxygen. This also creates a parasitic resistance, which lowers SNR in a functioning device.

Present solutions include reactive ion oxidation of the redeposition metal. In reactive ion oxidation energetic oxygen ions are used to partially oxidize the redep and re-oxidize or "heal" the barrier layer. Nevertheless, reactive ion oxidation has two detrimental effects. First, oxygen ions have the effect of reducing the thickness and dimensions of photoresists and carbon layers, which may be used to pattern the TMR device and its subsequent biasing layers. Secondly, oxygen ions can penetrate deeply into the sides of a TMR stack, reducing its effective area and damaging the free layer or pinned layer of such devices.

It can be seen that there is a need for a method and apparatus for oxidizing conductive redeposition in TMR sensors.

SUMMARY OF THE INVENTION

To overcome the limitations described above, and to overcome other limitations that will become apparent upon reading and understanding the present specification, the present invention discloses a method and apparatus for oxidizing conductive redeposition in TMR sensors.

The present invention solves the above-described problems by etching a TMR barrier layer and oxidizing redeposition material and healing the barrier using an oxidizing agent selected from the group consisting of ozone and water vapor.

A method for oxidizing conductive redeposition in tunnel magnetoresistive (TMR) structure in accordance with the principles of the present invention includes forming a TMR stack comprising a first electrode comprising at least a pinned layer and an antiferromagnetic (AFM) layer, a second electrode comprising a free layer and a tunnel barrier, etching at least one of the first electrode comprising at least the pinned layer and the antiferromagnetic (AFM) layer, the second electrode comprising the free layer and the tunnel barrier using a primarily physical etch process and applying an oxidizing agent selected from the group consisting of ozone and water vapor to oxidize at least a portion of the at least one of the layers.

In another embodiment of the present invention, a magnetic read head is provided. The magnetic read head includes an antiferromagnetic (AFM) layer, a pinned layer formed over the antiferromagnetic (AFM) layer and a tunnel barrier formed over the pinned layer, wherein the tunnel barrier is shaped in an etching chamber and then redeposition material proximate to the tunnel barrier is oxidized using an oxidizing agent selected from the group consisting of ozone and water vapor.

In another embodiment of the present invention, a magnetic storage device is provided. The magnetic storage device includes a magnetic media for storing data thereon, a motor, coupled to the magnetic media, for translating the magnetic media, a transducer for reading and writing data on the magnetic media and an actuator, coupled to the transducer, for moving the transducer relative to the magnetic media, wherein the transducer includes a read sensor including an antiferromagnetic (AFM) layer, a pinned layer formed over the antiferromagnetic (AFM) layer and a tunnel barrier formed over the pinned layer, wherein the tunnel barrier is shaped in an etching chamber and then redeposition material proximate to the tunnel barrier is oxidized using an oxidizing agent selected from the group consisting of ozone and water vapor.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for oxidizing conductive redeposition in TMR sensors. In an embodiment of the present invention, a TMR barrier layer is etched. Redeposition material is oxidized and the barrier is healed using an oxidizing agent selected from the group consisting of ozone and water vapor.

Figure 1:
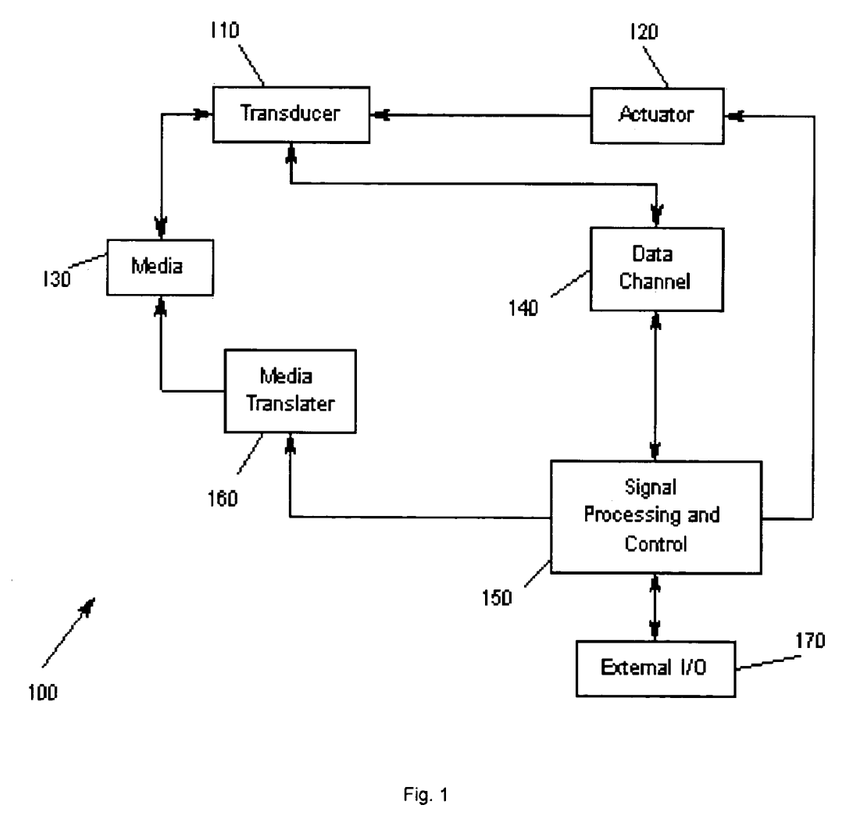
FIG. 1 illustrates a storage system according to an embodiment of the present invention.

FIG. 1 illustrates an exemplary storage system 100 according to the present invention. A transducer 110 is under control of an actuator 120, whereby the actuator 120 controls the position of the transducer 110. The transducer 110 writes and reads data on magnetic media 130. The read/write signals are passed to a data channel 140. A signal processor 150 controls the actuator 120 and processes the signals of the data channel 140 for data exchange with external Input/Output (I/O) 170. I/O 170 may provide, for example, data and control conduits for a desktop computing application, which utilizes storage system 100. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
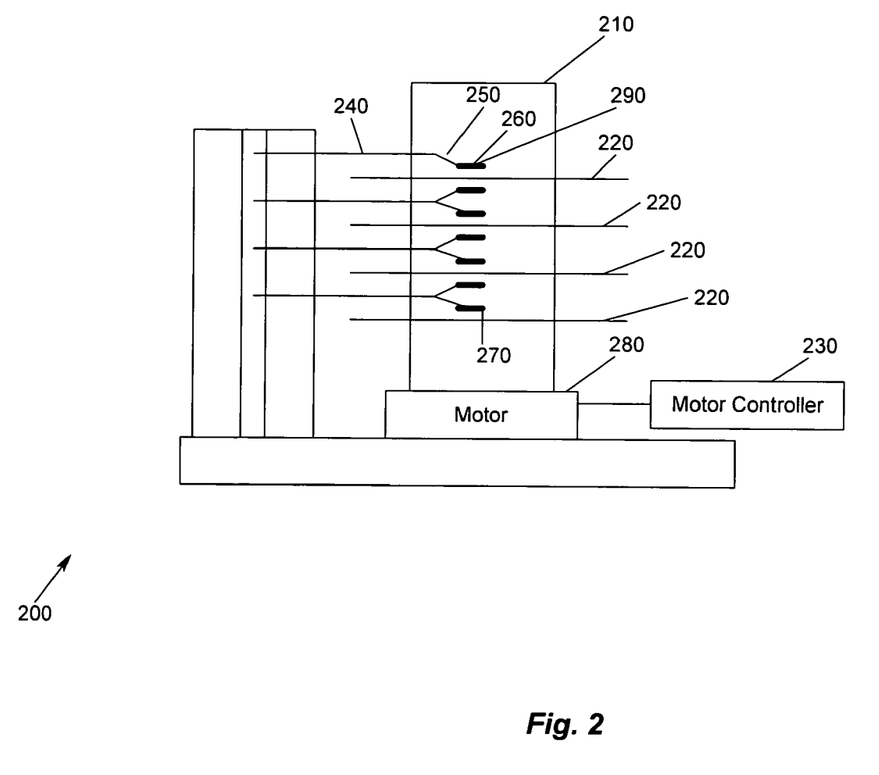
FIG. 2 illustrates one storage system according to an embodiment of the present invention.

FIG. 2 illustrates one particular embodiment of a multiple magnetic disk storage system 200 according to the present invention. In FIG. 2, a hard disk drive storage system 200 is shown. The system 200 includes a spindle 210 that supports and rotates multiple magnetic disks 220. The spindle 210 is rotated by motor 280 that is controlled by motor controller 230. A combined read and write magnetic head 270 is mounted on slider 240 that is supported by suspension 250 and actuator arm 240. Processing circuitry exchanges signals that represent information with read/write magnetic head 270, provides motor drive signals for rotating the magnetic disks 220, and provides control signals for moving the slider 260 to various tracks. Although a multiple magnetic disk storage system is illustrated, a single magnetic disk storage system is equally viable in accordance with the present invention.

The suspension 250 and actuator arm 240 position the slider 260 so that read/write magnetic head 270 is in a transducing relationship with a surface of magnetic disk 220. When the magnetic disk 220 is rotated by motor 280, the slider 240 is supported on a thin cushion of air (air bearing) between the surface of disk 220 and the ABS 290. Read/write magnetic head 270 may then be employed for writing information to multiple circular tracks on the surface of magnetic disk 220, as well as for reading information therefrom.

Figure 3:
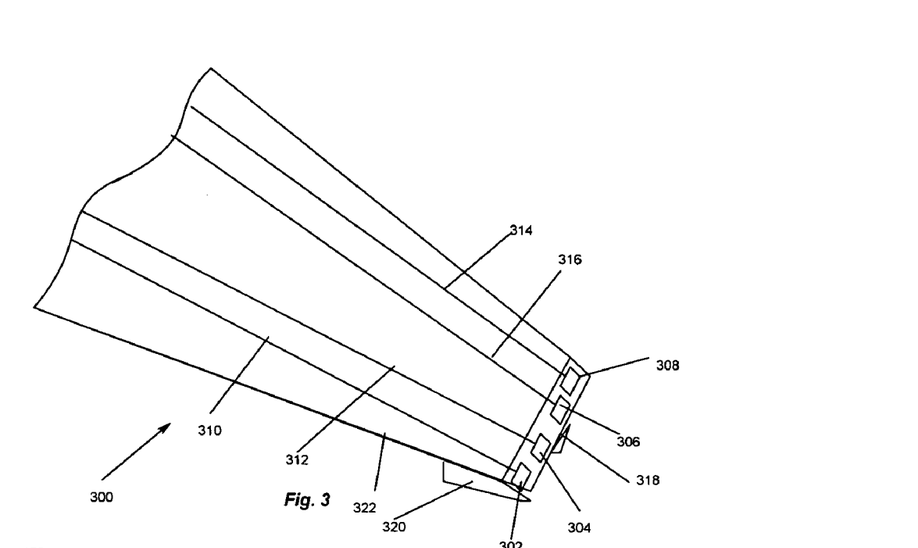
FIG. 3 illustrates a slider mounted on a suspension according to an embodiment of the present invention.

FIG. 3 illustrates a sensor assembly 300. In FIG. 3, a slider 320 is mounted on a suspension 322. First and second connections 302 and 308 connect leads from the sensor 318 to leads 310 and 314, respectively, on suspension 322 and third and fourth connections 304 and 306 connect to the write coil (not shown) to leads 312 and 316, respectively, on suspension 322.

Figure 4:
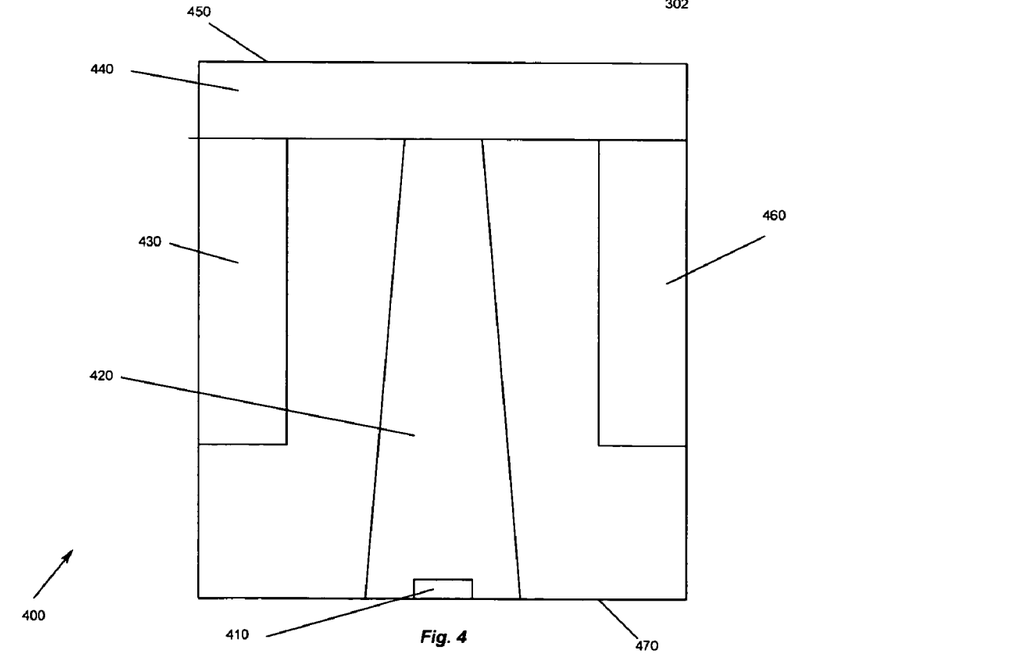
FIG. 4 illustrates an ABS view of the slider and the magnetic head according to an embodiment of the present invention.

FIG. 4 is an ABS view of slider 400 and magnetic head 410. The slider has side rails 430 and 460 and a center rail 420. A magnetic head 410 is provided and may be supported on the central rail 420. However, the head may be disposed otherwise, e.g., on a side rail. The rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of a typical magnetic recording disk drive system, shown in the accompanying FIGS. 1–4, is for presentation purposes only. Storage systems may contain a large number of recording media and actuators, and each actuator may support a number of sliders. In addition, instead of an air-bearing slider, the head carrier may be one that maintains the head in contact or near contact with the disk, such as in liquid bearing and other contact and near-contact recording disk drives.

Figures 5, 6, 7:
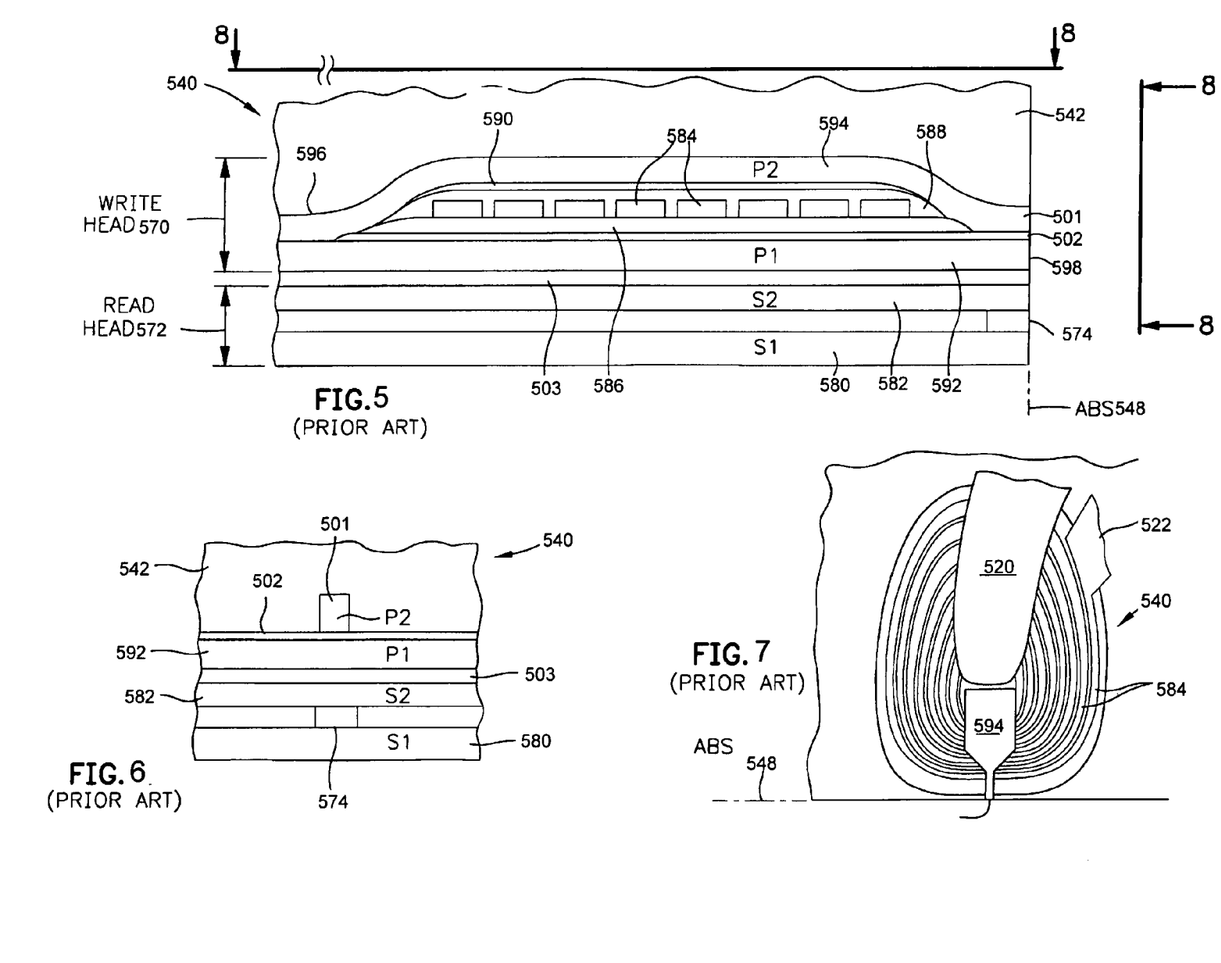
FIG. 5 is a side cross-sectional elevation view of a magnetic head.
FIG. 6 is an air bearing surface (ABS) view of the magnetic head of FIG. 5.
FIG. 7 illustrates the connect leads coupled to the coil for the write pole piece.

FIG. 5 is a side cross-sectional elevation view of a magnetic head 540. The magnetic head 540 includes a write head portion 570 and a read head portion 572. The read head portion 572 includes a sensor 574. FIG. 6 is an ABS view of the magnetic head of FIG. 5. The sensor 574 is sandwiched between first and second shield layers 580 and 582. In a piggyback head as shown in FIG. 5, the second shield layer (S2) 582 and the first pole piece (P1) 592 are separate layers. The first and second shield layers 580 and 582 protect the MR sensor element 574 from adjacent magnetic fields. More conventionally, the second shield 582 also functions as the first pole (P1) 592 of the write element, giving rise to the term "merged MR head." However, the present invention is not meant to be limited to a particular type of MR head.

In response to external magnetic fields, the resistance of the sensor 574 changes. A sense current Is conducted through the sensor causes these resistance changes to be manifested as voltage changes. These voltage changes are then processed as readback signals by the signal processing system 350 shown in FIG. 3.

The write head portion of the magnetic head includes a coil layer 584 sandwiched between first and second insulation layers 586 and 588. A third insulation layer 590 may be employed for planarizing the head to eliminate ripples in the second insulation layer caused by the coil layer 584. An insulation layer 542 is formed over the second pole piece layer 594. The first, second and third insulation layers are referred to in the art as an "insulation stack." The coil layer 584 and the first, second and third insulation layers 586, 588 and 590 are sandwiched between first and second pole piece layers 592 and 594. The first and second pole piece layers 592 and 594 are magnetically coupled at a back gap 596 and have first and second pole tips 598 and 501 which are separated by a write gap layer 502 at the ABS 548. The first pole piece layer 592 is separated from the second shield layer 582 by an insulation layer 503.

FIG. 7 illustrates a view of the connect leads 520, 522 coupled to the coil 584 for the write pole piece 594. As shown in FIGS. 3–7, first and second connections 304 and 306 connect leads from the sensor 574 to leads 312 and 314 on the suspension 344, and third and fourth connections 316 and 318 connect leads 520 and 522 from the coil 584 (see FIG. 7) to leads 324 and 326 on the suspension. While FIG. 7 shows an "overpass" design, those skilled in the art will recognize that other designs, such as an "underpass" design are possible. Thus, the present invention is not meant to be limited to a specific write head design.

Figure 8:
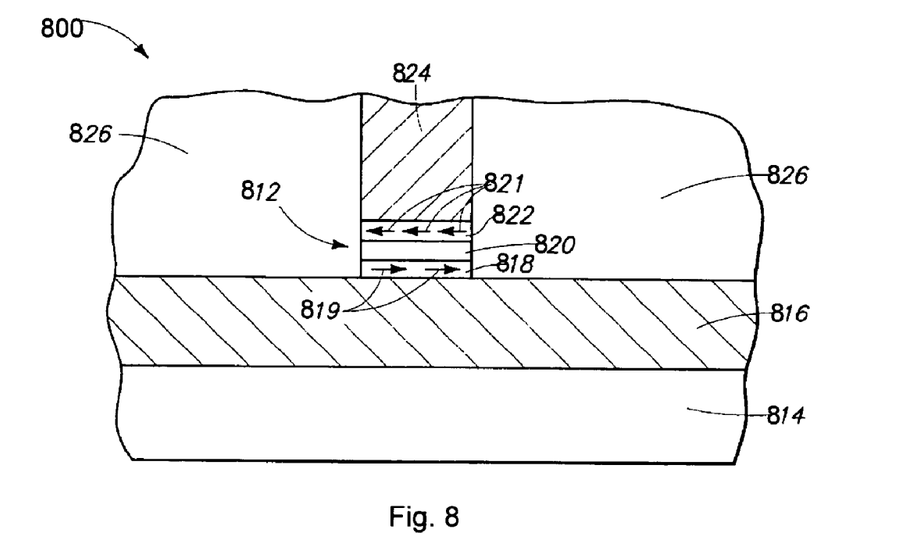
FIG. 8 is a diagrammatic, cross-sectional view of a fragment illustrating an MRAM device.

FIG. 8 illustrates a diagram 800 of an exemplary an MRAM device 812. More specifically, diagram 800 comprises a substrate 814 having a conductive line 816 formed thereover, and device 12 is formed over the conductive line. Substrate 814 can comprise an insulative material and/or may comprise numerous materials and layers. The term "substrate" refers to any supporting structure, including, but not limited to, the semiconductive substrates.

Conductive line 816 can comprise, for example, various metals and metal alloys. The MRAM device 812 formed over line 816 comprises three primary layers, 818, 820 and 822. Layers 818 and 822 comprise soft magnetic materials. Layer 820 comprises a non-magnetic material. The non-magnetic material is an electrically insulative material (such as, for example, aluminum oxide ($Al_2O_3$) or silicon dioxide).

Layers 818 and 822 have magnetic moments associated therewith illustrated by arrows 819, 821. In the shown construction, the magnetic moment in layer 822 is anti-parallel to the magnetic moment in layer 818. Such is one of two stable orientations for the magnetic moment of layer 822 relative to that of 818, with the other stable orientation being a parallel orientation of the magnetic moment in layer 822 relative to the moment in layer 818. One of layers 818 and 822 can have a pinned orientation of the magnetic moment therein, and such can be accomplished by providing a hard magnetic layer, or in other words a permanent magnet (not shown) adjacent the layer. The layer having the pinned magnetic moment can be referred to as a reference layer.

In operation, MRAM device 812 can store information as a relative orientation of the magnetic moment in layer 822 to that in layer 818. Specifically, one of the anti-parallel or parallel orientations of the magnetic moments of layers 818 and 822 can be designated as a 0, and the other of the anti-parallel and parallel orientations can be designated as a 1. Accordingly, a data bit can be stored within device 812 as the relative orientation of magnetic moments in layers 818 and 822.

A conductive line 824 is shown over layer 822, and such conductive line extends into and out of the plane of the page. Conductive line 824 can comprise, for example, one or more metals and/or metal alloys, including, for example, copper and/or aluminum. An insulative material 826 extends over conductive line 816, and along the sides of bit 812 and conductive line 824.

The diagram 800 is an exemplary MRAM construction, and it is to be understood that various modifications can be made to the construction 810 for various applications. For instance, one or more electrically insulative layers (not shown) can be provided between device 812 and one or both of conductive lines 816 and 824. Also, one or more magnetic layers (not shown) can be stacked within device 812 in addition to the shown layers 818 and 822.

In operation, data is written to MRAM device 812 by passing current along the conductive lines 816 and 824 to change the relative magnetic orientation of layers 818 and 822 (i.e., to flip the relative orientation from parallel to anti-parallel, or vice versa). In theory, the relative orientation of layers 818 and 822 can be flipped by passing sufficient current along only one of lines 816 and 824, but in practice it is generally found to be advantageous to utilize both of lines 816 and 824 in writing information to device 812. Specifically, some current is initially passed along one of the lines 816 and 824 to induce a magnetic field in device 812 which starts to flip the relative magnetic orientation of layers 818 and 822, and then current is passed along the other of layers 816 and 824 to complete the flip of the relative magnetic orientation within device 812.

The operation of reading information from device 812 can utilize either inductive sensing or magnetoresistive sensing to detect the relative magnetic orientation of layers 818 and 822 within the device. The reading can utilize one or both of lines 816 and 824, and/or can utilize a separate conductive line (not shown).

It is advantageous to have lines 816 and 824 be orthogonal to one another at the location of device 812 to maximize the complementary effect of utilizing both of conductive lines 816 and 824. A device that utilizes a pair of independently controlled conductive lines for writing to and/or reading from an MRAM device is typically referred to as a half-select MRAM construction. Typically, one of the orthogonal lines 816 and 824 will be designated as inducing field $H_x$ parallel to the moments of layers 822 and 818 (with layer 824 inducing $H_x$ in the shown embodiment), and the other will be designated as inducing field $H_y$ perpendicular to the moments of layers 822 and 818 (with layer 816 inducing $H_y$ in the shown embodiment). Accordingly, layers 816 and 824 induce orthogonal magnetic fields within MRAM device 812.

Figure 9:
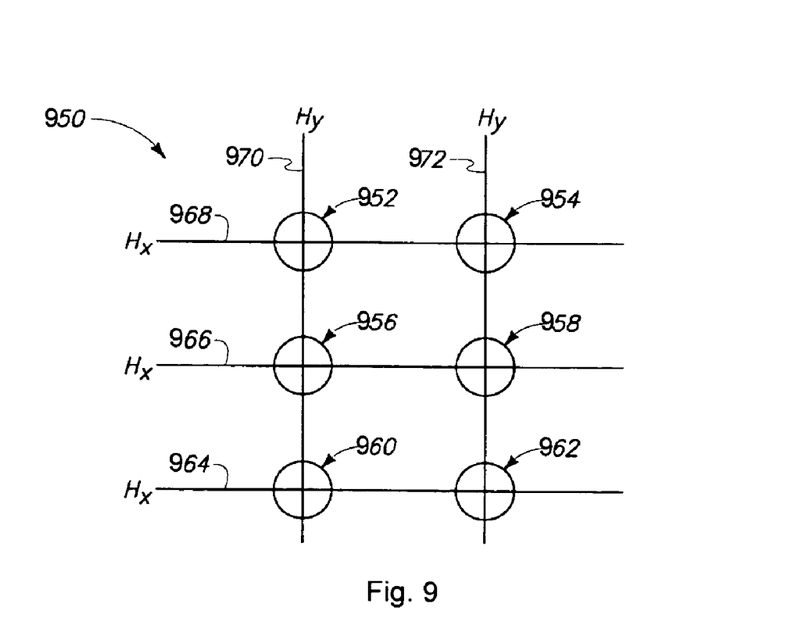
FIG. 9 is a diagrammatic illustration of a memory array comprising MRAM devices.

As discussed above, a single MRAM device can store a single bit of information. Accordingly, in applications in which it is desired to process multiple bits of information, it is generally desired to utilize a plurality of MRAM devices, with each of the devices independently storing bits of information. The devices will typically be arranged in an array, and an exemplary array 950 of MRAM devices is illustrated in FIG. 9. The array comprises individual MRAM devices 952, 954, 956, 958, 960 and 962. The array also comprises a plurality of conductive lines 964, 966 and 968 utilized for inducing $H_x$, and a plurality of conductive lines 970 and 972 utilized for inducing $H_y$.

Figure 10:
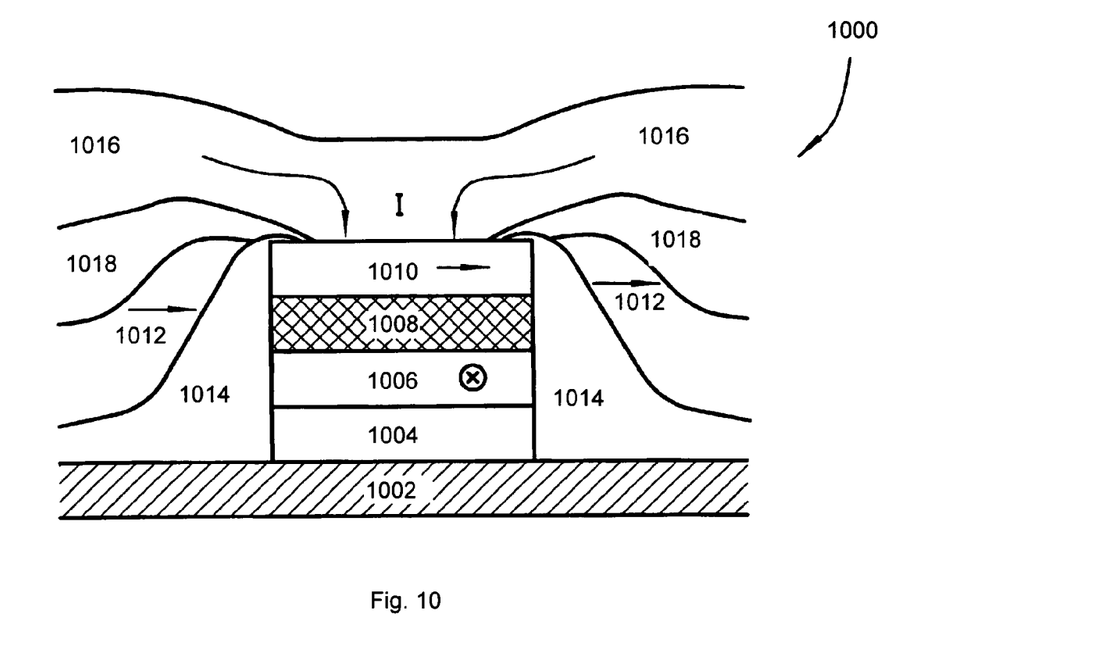
FIG. 10 is an air bearing surface view of a magnetic tunnel junction sensor.

FIG. 10 shows one variant of a current-perpendicular-to-plane (CPP) TMR sensor 1000 according to an embodiment of the present invention. Sensor 1000 includes a ferromagnetic reference layer 1006 with a fixed magnetic moment oriented transversely (into the page) and a ferromagnetic free layer 1010 with a rotatable magnetization vector, which can rotate about the longitudinal direction in response to transverse magnetic signal fields. The direction of the magnetic moment of the reference layer 1006 is typically fixed by exchange coupling with an antiferromagnetic layer 1004. The exchange-pinned reference layer 1006 and free layer 1010 are spaced apart by an electrically insulating tunnel barrier layer 1008. Hard bias layers 1012 are electrically insulated from the sensor stack and the top electrical lead 1016 by insulating layers 1014 and 1018 respectively. Hard bias layers 1012 provide a longitudinal biasing magnetic field to stabilize the magnetization of the free layer 1010. Sensor 1000 further includes a layer 1002, which may act as an electrical contact. Those skilled in the art will recognize that the present invention is not meant to be limited to the particular CPP TMR sensor 1000 shown in FIG. 10. Rather, other configurations, e.g., one that uses an in stack bias, are within the scope of the present invention.

Figure 11:
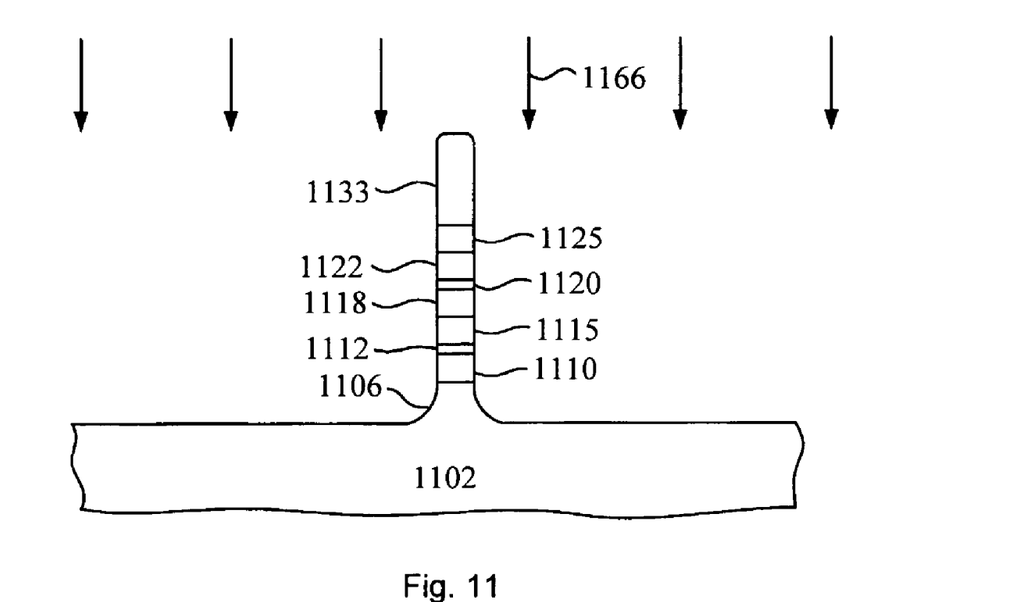
FIG. 11 shows removal of particles in a substantially normal direction to a wafer surface.

FIG. 11 shows removal of particles in a substantially normal direction to a wafer surface, as shown by arrows 1166. The height of layer 1133 is also reduced, and that layer as well as the sensor layers may be thinned slightly. The particular sensor embodiment shown in FIG. 11 includes a first magnetically permeable shield 1102, which in the embodiment shown in FIG. 11 includes tapered regions 1106. However, tapered regions 1106 are not essential and in some designs not present. In fact, in some designs, etching does not go down past the pinned layer 1118.

An optional electrically conductive, nonmagnetic spacer 1110, which may for instance be formed of copper (Cu) or a noble metal, adjoins the tapered section 1106 of the first shield. An optional electrically conductive seed layer 1112 made of a material such as tantalum (Ta) or nickel-iron-chromium (NiFeCr) is disposed between an antiferromagnetic layer 1115 and spacer 1110. Antiferromagnetic layer 1115 stabilizes a magnetic moment of an adjoining pinned ferromagnetic layer 1118 in a direction toward or away from the media. A tunneling layer 1120 made of non conducting material such as a dielectric separates pinned layer 1118 from a free ferromagnetic layer 1122, which has a magnetic moment that is able to rotate in the presence of a magnetic field from a media. In the absence of a magnetic field from a media, free layer 1122 has a magnetic moment substantially parallel to the media surface. A second optional electrically conductive, nonmagnetic spacer 1125 may be provided. A layer 1133 comprising a photoresist layer or hard mask, such as carbon, adjoins the spacer 1125.

Figure 12:
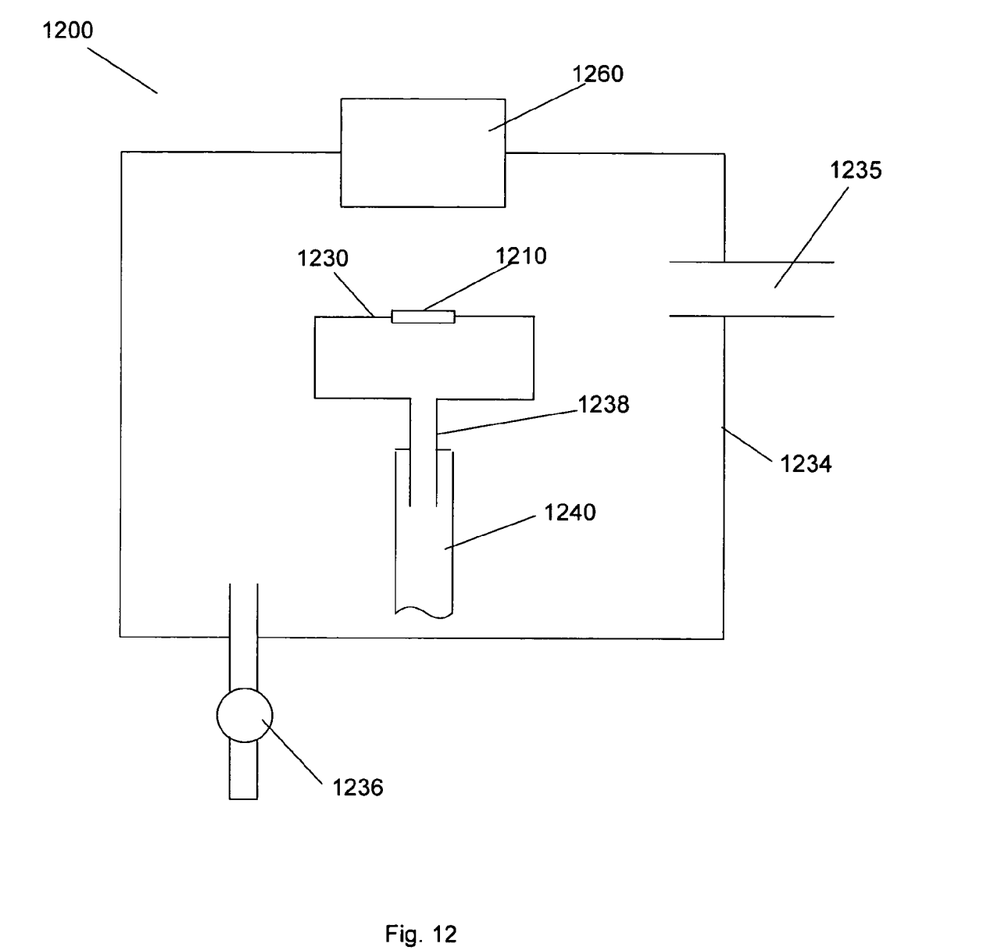
FIG. 12 is a schematic diagram showing an ion milling apparatus.

FIG. 12 is a schematic diagram 1200 showing an ion milling apparatus. In FIG. 12, a specimen 1210 is supported by support arms 1230 of a specimen holder in vacuum chamber 1234 for recording head applications or a Si wafer for MRAM applications. Suitable means, such as a high vacuum pump 1236 capable of reducing the pressure in chamber 1234 are used to evacuate the chamber. The pedestal 1238 of the specimen holder is fitted onto a holder mount 1240. Holder mount 1240 may be rotated, by suitable rotary drive means (not shown), to cause specimen 1210 to rotate during ion milling. A gas introducing port 1235 is provided in the chamber 1234. An ion milling gas is supplied through the gas introducing port 1235, while excitation is provided by RF source 1260.

Figure 13:
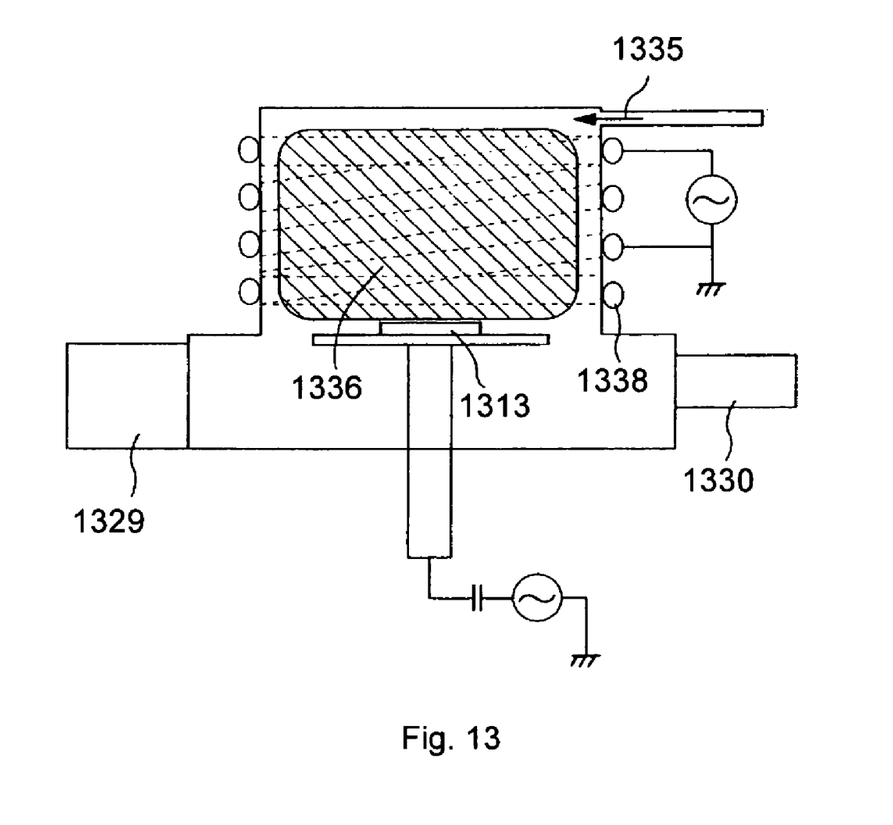
FIG. 13 shows a high-frequency induction type RIE apparatus.

The etching process may also be realized using a reactive ion etching (RIE) process. FIG. 13 shows a high-frequency induction type RIE apparatus. In FIG. 13, numeral 1313 denotes a substrate, 1329 denotes a vacuum pump, 1330 denotes a specimen exchanging chamber, 1335 denotes a gas introducing port, 1336 designates plasma and 1338 denotes a coil. The apparatus now concerned features a high plasma density. An etching gas is fed through the gas introducing port 1335 with the plasma 1336 being excited by applying a high-frequency electric power to the coil 1338 while a bias voltage is applied to the substrate, whereby ions are caused to impinge into the substrate to effectuate the process.

During the patterning of tunnel magnetoresistive (TMR) sensors, an etching process such as reactive ion etching or ion milling etching are used. The etching process is realized primarily by resorting to a physical removal effect based on high-energy ion impact. Consequently, all the particulates sputtered by the physical etching are not always removed by the vacuum pump but some part of the sputtered particulates are usually deposited on the remaining structure. This phenomenon will be referred to as the re-deposition. As described earlier, the redepostion material can be conductive and cause parasitic resistance, which lowers the SNR in a functioning device. Also, there may be ion damage to the barrier layer. TMR structures typically employ an oxide insulator barrier layer. The ion milling and RIE are both prone to damage the edge of the oxide insulator barrier layer and deplete it of oxygen. This also creates a parasitic resistance that lowers SNR in a functioning device.

Figure 14:
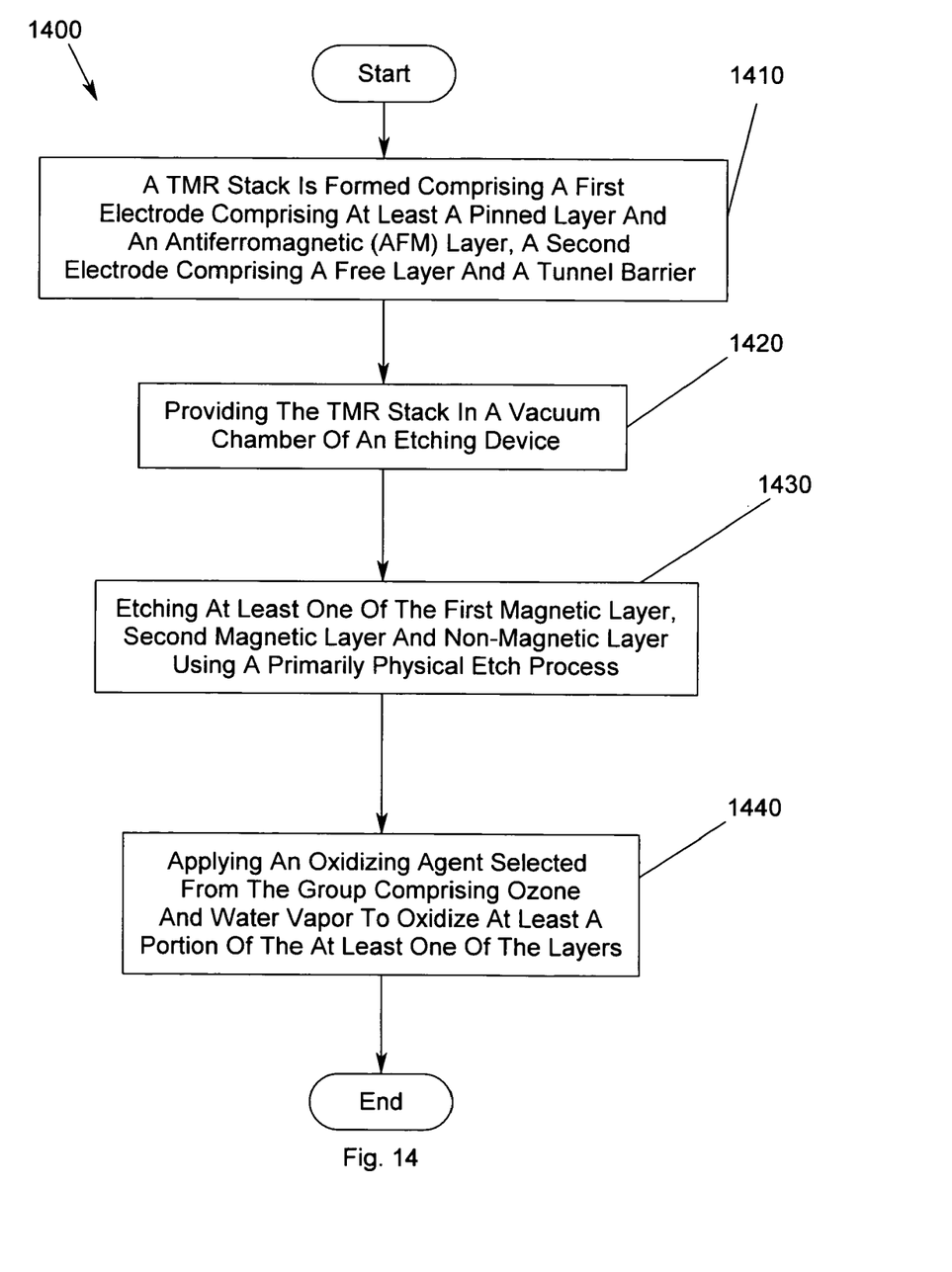
FIG. 14 is a flow chart of the method for oxidizing conductive redeposition in TMR sensors according to an embodiment of the present invention.

FIG. 14 is a flow chart 1400 of the method for oxidizing conductive redeposition in TMR sensors according to an embodiment of the present invention. In FIG. 14, a TMR stack is formed comprising a first magnetic layer, a second magnetic layer, and a non-magnetic layer between the first and second magnetic layers 1410. The TMR stack is disposed in a vacuum chamber of an etching device 1420. At least one of the first magnetic layer, second magnetic layer and non-magnetic layer is etched using a primarily physical etch process in a reaction chamber 1430. An oxidizing agent selected from the group consisting of ozone and water vapor is applied to oxidize at least a portion of the at least one of the layers 1440. While it is possible to introduce ozone or water vapor during the etching process, e.g., the ion beam etching process, embodiments of the present invention may also include first etching and then oxidizing the TMR stack. Ozone and water vapor, when applied in a controlled manner and at elevated temperature, can readily oxidize the redeposition material and heal the TMR barrier layer. The elevated temperature may be 100° C. and greater. Water vapor, when similarly applied, is known to readily oxidize metal materials. The oxidation may be performed at a variety of temperatures from room temperature up until the damage threshold of the TMR stack, e.g., around 300 C.

Figure 15:
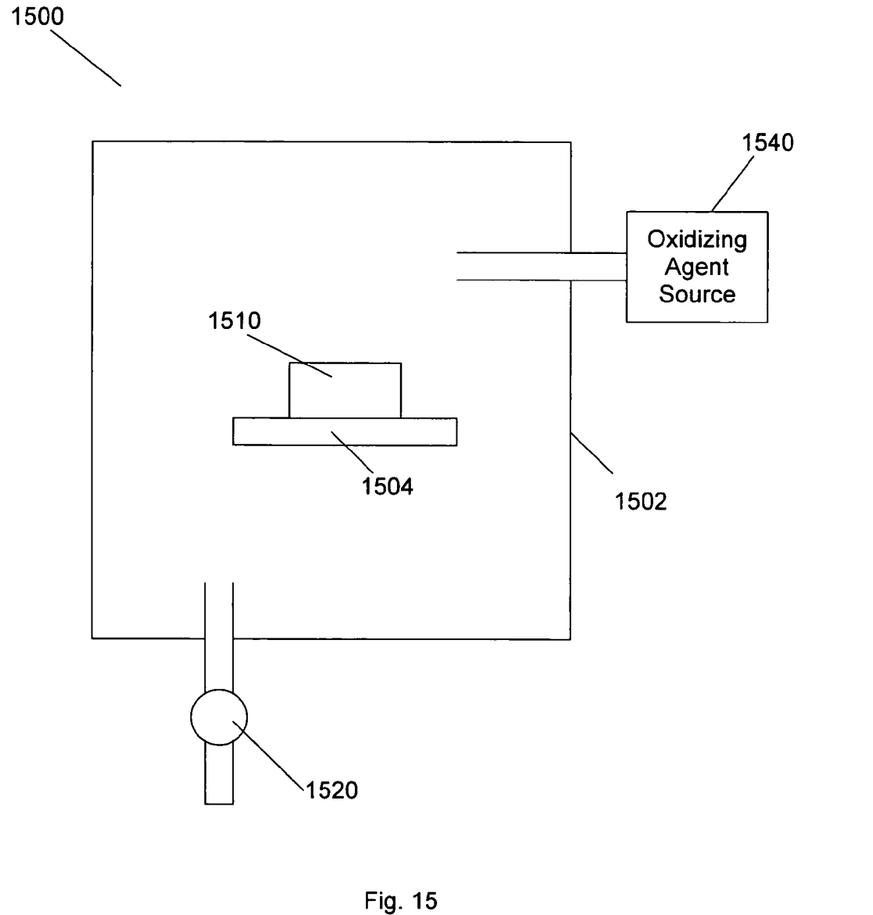
FIG. 15 shows a dosing chamber for applying an oxidizing agent selected from the group consisting of ozone and water vapor according to an embodiment of the present invention.

Either of these procedures may be performed in a vacuum system, e.g., an atomic layer deposition (ALD) reactor. FIG. 15 shows a dosing chamber 1500 for oxidizing redeposition material and healing the barrier using an oxidizing agent selected from the group consisting of ozone and water vapor according to an embodiment of the present invention. In FIG. 15, a vacuum chamber 1502 includes a substrate holder 1504 for holding an etched TMR stack 1510. A pump 1520 reduces the pressure in chamber 1502 to evacuate the chamber 1502. An oxidizing agent source 1540 is provided for generating the ozone or the water vapor. The oxidizing agent source 1540 subjects the TMR stack 1510 in the vacuum chamber 1502 to a controlled dose of ozone or water vapor. For example, a water vapor source might consist of a "bubbler" arrangement in which a carrier gas such as Ar or $N_2$ is bubbled through water vapor either at room temperature or at elevated temperature and then delivered through the inlet to the vacuum system 1502. For the ozone generator, a commercially available instrument may be used, which takes $O_2$ as its input and uses an electrical discharge to turn it into high concentrations of ozone. The water vapor or ozone can be applied in a continuous or pulsed basis as necessary. In addition, the surface can then be terminated with layers of additional oxide, which act as an insulating spacer between the TMR sensor and any subsequent bias materials.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for oxidizing conductive redeposition in tunnel magnetoresistive (TMR) structure, comprising:
    forming a TMR stack comprising a first electrode comprising at least a pinned layer and an antiferromagnetic (AFM) layer, a second electrode comprising a free layer and a tunnel barrier layer;
    etching at least one of the first electrode comprising at least the pinned layer and the antiferromagnetic (AFM) layer, the second electrode comprising the free layer and the tunnel barrier using a primarily physical etch process, wherein the etching redeposits etching particulates on at least a portion of the at least one of the layers; and
    applying at an elevated temperature an oxidizing agent selected from the group consisting of ozone and water vapor to oxidize only at least one of the redeposited etching particulates and a portion the tunnel barrier layer damaged during the etching.

2. The method of claim 1, wherein the applying the oxidizing agent comprises applying water vapor on a continuous basis.

3. The method of claim 1, wherein the applying the oxidizing agent comprises applying ozone on a continuous basis.

4. The method of claim 1, wherein the applying the oxidizing agent comprises pulsing water vapor into a chamber.

5. The method of claim 1, wherein the applying the oxidizing agent comprises pulsing ozone into a chamber.

6. The method of claim 1 further comprising terminating the oxidized surface with layers of additional oxide that acts as an insulating spacer over the TMR structure.

7. The method of claim 1, wherein the applying the oxidizing agent comprises applying ozone in a controlled manner and at the elevated temperature for oxidizing redeposited etching particulates.

8. The method of claim 1, wherein the applying the oxidizing agent comprises applying water vapor in a controlled manner and at the elevated temperature for oxidizing redeposited etching particulates.

9. The method of claim 1, wherein the applying the oxidizing agent comprises applying ozone to the tunnel barrier layer to heal the tunnel barrier layer.

10. The method of claim 1, wherein the applying the oxidizing agent comprises applying water vapor to oxidize the redeposited etching particulates comprising a metal material.

11. The method of claim 1 further comprising a magnetic random access memory (MRAM) formed according to the method of claim 1.

12. The method of claim 1 further comprising a magnetic read sensor for a storage device formed according to the method of claim 1.

* * * * *